United States Patent
Sun

(10) Patent No.: US 11,417,710 B2
(45) Date of Patent: Aug. 16, 2022

(54) ORGANIC LIGHT-EMITTING DISPLAY PANEL AND MANUFACTURING METHOD THEREOF, AND ORGANIC LIGHT-EMITTING DISPLAY DEVICE

(71) Applicant: BOE TECHNOLOGY GROUP CO., LTD., Beijing (CN)

(72) Inventor: Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 258 days.

(21) Appl. No.: 16/713,655

(22) Filed: Dec. 13, 2019

(65) Prior Publication Data

US 2020/0312915 A1 Oct. 1, 2020

(30) Foreign Application Priority Data

Mar. 29, 2019 (CN) .......................... 201910252385.3

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3211* (2013.01); *H01L 51/5237* (2013.01); *H01L 51/56* (2013.01)

(58) Field of Classification Search
CPC . H01L 27/322; H01L 27/321; H01L 51/5237; H01L 51/56
See application file for complete search history.

(56) References Cited

U.S. PATENT DOCUMENTS

| | | | | |
|---|---|---|---|---|
| 2007/0146914 A1* | 6/2007 | Yamamoto | ............. | G02B 5/223 359/884 |
| 2015/0349291 A1* | 12/2015 | Song | .................. | H01L 27/3246 257/40 |
| 2018/0113357 A1* | 4/2018 | Han | .................. | G02F 1/133514 |
| 2019/0148459 A1 | 5/2019 | He et al. | | |

FOREIGN PATENT DOCUMENTS

CN 107845668 A 3/2018

* cited by examiner

*Primary Examiner* — Trang Q Tran
(74) *Attorney, Agent, or Firm* — Dilworth & Barrese, LLP.; Michael J. Musella, Esq.

(57) ABSTRACT

An organic light-emitting display panel and a manufacturing method thereof and an organic light-emitting display device are provided. The organic light-emitting display panel includes a first light-emitting element, a second light-emitting element, a first color filter layer, a second color filter layer; a color of light emitted by the first light-emitting element is different from a color of light emitted by the second light-emitting element and is same as a color of the first color filter layer, and the color of the light emitted by the second light-emitting element is same as a color of the second color filter layer, a brightness attenuation speed of the light emitted by the first light-emitting element is faster than a brightness attenuation speed of the light emitted by the second light-emitting element; the first color filter layer has a first convex surface; and/or the second color filter layer has a first concave surface.

12 Claims, 4 Drawing Sheets

ORGANIC LIGHT-EMITTING DISPLAY PANEL AND MANUFACTURING METHOD THEREOF, AND ORGANIC LIGHT-EMITTING DISPLAY DEVICE

The application claims priority to the Chinese patent application No. 201910252385.3, filed on Mar. 29, 2019, the entire disclosure of which is incorporated herein by reference as part of the present application.

TECHNICAL FIELD

At least one embodiment of the present disclosure relates to an organic light-emitting display panel, a manufacturing method of an organic light-emitting display panel and an organic light-emitting display device.

BACKGROUND

With the development of display technology, organic light-emitting diode (OLED) display devices have attracted extensive attentions because of their advantages of self-luminescence and large visual angles. In the organic light-emitting display device, for example, color resistance layers (or color filter layers, CFs) of different colors are formed on a light-emitting elements (ELs) after forming an encapsulation structure by a technology of arranging the color filter layers on the light-emitting elements (CFs on ELs, COE). The COE technology has advantages of improving color purity of the display device, reducing a thickness of the display panel, and the like.

SUMMARY

At least one embodiment of the present disclosure provides an organic light-emitting display panel, and the organic light-emitting display panel comprises a substrate, a first light-emitting element and a second light-emitting element both on the substrate; a first color filter layer on a light exiting side of the first light-emitting element and a second color filter layer on a light exiting side of the second light-emitting element; a color of light emitted by the first light-emitting element is different from a color of light emitted by the second light-emitting element; the color of the light emitted by the first light-emitting element is same as a color of the first color filter layer, and the color of the light emitted by the second light-emitting element is same as a color of the second color filter layer; with an increase of an exiting angle, a brightness attenuation speed of the light emitted by the first light-emitting element is faster than a brightness attenuation speed of the light emitted by the second light-emitting element, and the exiting angle is an included angle between exiting light and a normal perpendicular to the substrate; and the first color filter layer has a first convex surface protruding toward a side away from the first light-emitting element, and the first convex surface is on a side of the first color filter layer away from the first light-emitting element; and/or the second color filter layer has a first concave surface recessed toward a side close to the second light-emitting element, and the first concave surface is on a side of the second color filter layer away from the second light-emitting element.

For example, in the organic light-emitting display panel provided by at least one embodiment of the present disclosure, the first color filter layer has the first convex surface, the first convex surface has a first symmetrical center, and an exiting angle of the light emitted by the first light-emitting element at the first symmetrical center is 0°; and the second color filter layer has the first concave surface, the first concave surface has a second symmetrical center, and an exiting angle of the light emitted by the second light-emitting element at the second symmetrical center is 0°.

For example, in the organic light-emitting display panel provided by at least one embodiment of the present disclosure, a thickness of the first color filter layer at the first symmetrical center of the first convex surface is equal to a thickness of the second color filter layer at the second symmetrical center of the first concave surface, and both the thickness of the first color filter layer at the first symmetrical center of the first convex surface and the thickness of the second color filter layer at the second symmetrical center of the first concave surface are a central thickness; the thickness of the first convex surface gradually decreases from the first symmetrical center of the first convex surface to two opposite edges of the first convex surface; the thickness of the first concave surface gradually increases from the second symmetrical center of the first concave surface to two opposite edges of the first concave surface.

For example, in the organic light-emitting display panel provided by at least an embodiment of the present disclosure, a thickness of the first color filter layer and a thickness of the second color filter layer are configured such that a light intensity of white light formed by mixing monochromatic light emitted from the first color filter layer at any non-zero exiting angle and monochromatic light emitted from the second color filter layer at the any non-zero exiting angle is same as a light intensity of white light with an exiting angle of 0°.

For example, the organic light-emitting display panel provided by at least one embodiment of the present disclosure further comprises a third light-emitting element and a third color filter layer; the third color filter layer is on a light exiting side of the third light-emitting element; a color of light emitted by the third light-emitting element is different from both the color of the light emitted by the first light-emitting element and the color of the light emitted by the second light-emitting element; the color of the light emitted by the third light-emitting element is same as a color of the third color filter layer; with the increase of the exiting angle, a brightness attenuation speed of the light emitted by the third light-emitting element is between the brightness attenuation speed of the light emitted by the first light-emitting element and the brightness attenuation speed of the light emitted by the second light-emitting element; and a surface of the third color filter layer on a side of the third color filter layer away from the third light-emitting element comprises a second convex surface protruding toward a side away from the third light-emitting element, or a second concave surface recessed toward a side close to the third light-emitting element, or a flat surface.

For example, in the organic light-emitting display panel provided by at least one embodiment of the present disclosure, the third color filter layer has the second convex surface, and a curvature of the second convex surface of the third color filter layer is smaller than a curvature of the first convex surface of the first color filter layer; or, the third color filter layer has the second concave surface, and a curvature of the second concave surface of the third color filter layer is smaller than a curvature of the first concave surface of the second color filter layer.

For example, in the organic light-emitting display panel provided by at least one embodiment of the present disclosure, all of the thickness of the first color filter layer, the thickness of the second color filter layer and a thickness of the third color filter layer are in a range of 0.5 micron to 5 microns; and all of the curvature of the first convex surface, the curvature of the first concave surface, the curvature of the second convex surface and the curvature of the second concave surface are less than 0.036.

For example, in the organic light-emitting display panel provided by at least one embodiment of the present disclosure, a thickness of the third color filter layer at a third symmetrical center of the second convex surface, the thickness of the first color filter layer at the first symmetrical center of the first convex surface, and the thickness of the second color filter layer at the second symmetrical center of the first concave surface are equal to each other and all of which are the central thickness.

For example, in the organic light-emitting display panel provided by at least one embodiment of the present disclosure, a thickness $H_{\theta 1}$ of the first color filter layer at any non-zero exiting angle $\theta$ satisfies:

$$H_{\theta 1} = H_0 \cdot \cos\theta \cdot \log_{T_{01}} T_{\theta 1},$$

in which $H_0$ represents the central thickness, $\theta$ represents the any non-zero exiting angle, $T_{01}$ represents a light transmittance value of the first color filter layer in condition that the light exits from the first color filter layer at an exiting angle of 0°, and $T_{\theta 1}$ represents a light transmittance value of the first color filter layer in condition that the light exits from the first color filter layer at the any non-zero exiting angle of $\theta$;

a thickness $H_{\theta 2}$ of the second color filter layer at the any non-zero exiting angle $\theta$ satisfies:

$$H_{\theta 2} = H_0 \cdot \cos\theta \cdot \log_{T_{02}} T_{\theta 2},$$

in which $H_0$ represents the central thickness, $\theta$ represents the any non-zero exiting angle, $T_{02}$ represents alight transmittance value of the second color filter layer in condition that the light exits from the second color filter layer at the exiting angle of 0°, and $T_{\theta 2}$ represents a light transmittance value of the second color filter layer in condition that the light exits from the second color filter layer at the any non-zero exiting angle of $\theta$;

a thickness $H_{\theta 3}$ of the third color filter layer at the any non-zero exiting angle $\theta$ satisfies:

$$H_{\theta 3} = H_0 \cdot \cos\theta \cdot \log_{T_{03}} T_{\theta 3},$$

in which $H_0$ represents the central thickness, $\theta$ represents the any non-zero exiting angle, $T_{03}$ represents a light transmittance value of the third color filter layer in condition that the light exits from the third color filter layer at the exiting angle of 0°, and $T_{\theta 3}$ represents a light transmittance value of the third color filter layer in condition that the light exits from the third color filter layer at the any non-zero exiting angle of $\theta$.

For example, in the organic light-emitting display panel provided by at least one embodiment of the present disclosure, the first light-emitting element is a red light-emitting element configured to emit red light, the second light-emitting element is a green light-emitting element configured to emit green light, and the third light-emitting element is a blue light-emitting element configured to emit blue light.

For example, in the organic light-emitting display panel provided by at least one embodiment of the present disclosure, the $T_{\theta 1}$ of the first color filter layer, the $T_{\theta 2}$ of the second color filter layer and the $T_{\theta 3}$ of the third color filter layer are configured to allow that a chromaticity coordinate of white light formed by mixing the red light which is emitted at the any non-zero exiting angle of $\theta$ after passing through the first color filter layer, the green light which is emitted at the any non-zero exiting angle of $\theta$ after passing through the second color filter layer, and the blue light which is emitted at the any non-zero exiting angle of $\theta$ after passing through the third color filter layer is same as a chromaticity coordinate of white light formed by mixing the red light which is emitted at the first symmetrical center of the first color filter layer, the green light which is emitted at the second symmetrical center of the second color filter layer and the blue light which is emitted at the third symmetrical center of the third color filter layer.

At least one embodiment of the present disclosure further provides a method of manufacturing an organic light-emitting display panel, and the method comprises: providing a substrate; forming a first light-emitting element and a second light-emitting element on the substrate; forming a first color filter layer on a light exiting side of the first light-emitting element and forming a second color filter layer on a light exiting side of the second light-emitting element, in which a color of light emitted by the first light-emitting element is different from a color of light emitted by the second light-emitting element; the color of the light emitted by the first light-emitting element is same as a color of the first color filter layer, the color of the light emitted by the second light-emitting element is same as a color of the second color filter layer, with an increase of an exiting angle, a brightness attenuation speed of the light emitted by the first light-emitting element is faster than a brightness attenuation speed of the light emitted by the second light-emitting element, and the exiting angle is an included angle between exiting light and a normal perpendicular to the substrate; and the first color filter layer has a first convex surface protruding toward a side away from the first light-emitting element, and the first convex surface is on a side of the first color filter layer away from the first light-emitting element; and/or the second color filter layer has a first concave surface recessed toward a side close to the second light-emitting element, and the first concave surface is on a side of the second color filter layer away from the second light-emitting element.

For example, the manufacturing method of the organic light-emitting display panel provided by at least one embodiment of the present disclosure further comprises: forming a third light-emitting element on the substrate; and forming a third color filter layer on a light exiting side of the third light-emitting element, in which a color of light emitted by the third light-emitting element is different from both the color of the light emitted by the first light-emitting element and the color of the light emitted by the second light-emitting element; the color of the light emitted by the third light-emitting element is same as a color of the third color filter layer; with the increase of the exiting angle, a brightness attenuation speed of the light emitted by the third light-emitting element is between the brightness attenuation speed of the light emitted by the first light-emitting element and the brightness attenuation speed of the light emitted by the second light-emitting element; a surface of the third color filter layer on a side of the third color filter layer away from the third light-emitting element comprises a second convex surface protruding toward a side away from the third light-emitting element, or a second concave surface recessed toward a side close to the third light-emitting element, or a flat surface.

For example, in the manufacturing method of the organic light-emitting display panel provided by at least one embodiment of the present disclosure, the first color filter layer has the first convex surface, the first convex surface of the first color filter layer has a first symmetrical center, and the exiting angle of the light emitted at the first symmetrical center of the first convex surface is 0°, and forming the first convex surface of the first color filter layer comprises: forming a first color resistance film on the light exiting side of the first light-emitting element, etching the first color resistance film based on a two-tone mask, and controlling light transmittance at different positions of the two-tone mask to form the first color filter layer so that a thickness of the first color filter layer at the first symmetrical center of the first convex surface is a central thickness, and the thickness of the first color filter layer gradually decreases from the first symmetrical center of the first convex surface of the first color filter layer to two opposite edges of the first convex surface; the second color filter layer has the first concave surface, the first concave surface of the second color filter layer has a second symmetrical center, and the exiting angle of the light emitted at the second symmetrical center of the first concave surface is 0°, and forming the first concave surface of the second color filter layer comprises: forming a second color resistance film on the light exiting side of the second light-emitting element, etching the second color resistance film based on a two-tone mask, and controlling light transmittance at different positions of the two-tone mask to form the second color filter layer so that a thickness of the second color filter layer at the second symmetrical center of the first concave surface is the central thickness, and the thickness of the second color filter layer gradually increases from the second symmetrical center of the first concave surface of the second color filter layer to two opposites edges of the first concave surface; and the third color filter layer has the second convex surface, the second convex surface of the third color filter layer has a third symmetrical center, and the exiting angle of light emitted at the third symmetrical center of the second convex surface is 0°, and forming the second convex surface of the third color filter layer comprises: forming a third color resistance film on the light exiting side of the third light-emitting element, etching the third color resistance layer based on a two-tone mask, and controlling light transmittance at different positions of the two-tone mask to form the third color filter layer so that a thickness of the third color filter layer at the third symmetrical center of the second convex surface is the central thickness, and the thickness of the third color filter layer gradually decreases from the third symmetrical center of the second convex surface of the third color filter layer to two opposite edges of the second convex surface.

For example, in the manufacturing method of the organic light-emitting display panel provided by at least one embodiment of the present disclosure, the first light-emitting element is a red light-emitting element configured to emit red light, the second light-emitting element is a green light-emitting element configured to emit green light, and the third light-emitting element is a blue light-emitting element configured to emit blue light.

For example, in the manufacturing method of the organic light-emitting display panel provided by at least one embodiment of the present disclosure, the thickness of the first color filter layer, the thickness of the second color filter layer and the thickness of the third color filter layer are configured such that a light intensity of white light formed by mixing the red light emitted from the first color filter layer at any non-zero exiting angle, the green light emitted from the second color filter layer at the any non-zero exiting angle and the blue light emitted from the third color filter layer at the any non-zero exiting angle is same as a light intensity of white light at the exiting angle of 0°; the thickness of the first color filter layer at different positions, the thickness of the second color filter layer at different positions and the thickness of the third color filter layer at different positions are determined as follows: determining a light intensity ratio of the red light, the green light and the blue light at the any non-zero exiting angle based on a chromaticity value of the red light at the any non-zero exiting angle, a chromaticity value of the green light at the any non-zero exiting angle, a chromaticity value of the blue light at the any non-zero exiting angle, as well as a chromaticity value and a light intensity of the white light at the exiting angle of 0°, is the white light being formed by mixing the red light, the green light and the blue light; determining a light transmittance value of the first color filter layer in condition that the light exits from the first color filter layer at the any non-zero exiting angle, a light transmittance value of the second color filter layer in condition that the light exits from the second color filter layer at the any non-zero exiting angle and a light transmittance value of the third color filter layer in condition that the light exits from the third color filter layer at the any non-zero exiting angle according to brightness attenuation of the red light at the any non-zero exiting angle, brightness attenuation of the green light at the any non-zero exiting angle and brightness attenuation of the blue light at the any non-zero exiting angle, so that the red light after the brightness attenuation, the green light after the brightness attenuation and the blue light after the brightness attenuation satisfy the light intensity ratio of the red light, the green light and the blue light at the any non-zero exiting angle, and determining the thickness of the first color filter layer, the thickness of the second color filter layer and the thickness of the third color filter layer based on the light transmittance value of the first color filter layer in condition that the light exits from the first color filter layer at the any non-zero exiting angle, the light transmittance value of the second color filter layer in condition that the light exits from the second color filter layer at the any non-zero exiting angle and the light transmittance value of the third color filter layer in condition that the light exits from the third color filter layer at the any non-zero exiting angle.

For example, in the manufacturing method of the organic light-emitting display panel provided by at least one embodiment of the present disclosure, the light intensity ratio $L_{R\theta}:L_{G\theta}:L_{B\theta}$ of the red light, the green light and the blue light at the any non-zero exiting angle $\theta$ is determined by a formula as follows:

$$\begin{cases} x_{w_\theta} = \dfrac{x_{R\theta} \cdot (L_{R\theta}/y_{R\theta}) + x_{G\theta} \cdot (L_{G\theta}/y_{G\theta}) + x_{B\theta} \cdot (L_{B\theta}/y_{B\theta})}{(L_{R\theta}/y_{R\theta}) + (L_{G\theta}/y_{G\theta}) + (L_{B\theta}/y_{B\theta})} \\ y_{w\theta} = \dfrac{L_{R\theta} + L_{G\theta} + L_{B\theta}}{(L_{R\theta}/y_{R\theta}) + (L_{G\theta}/y_{G\theta}) + (L_{B\theta}/y_{B\theta})} \\ L_{R\theta} + L_{G\theta} + L_{B\theta} = 1 \end{cases},$$

in which, $L_{R\theta}$, $L_{G\theta}$ and $L_{B\theta}$ respectively represent a light intensity of the red light at the any non-zero exiting angle $\theta$, a light intensity of the green light at the any non-zero exiting angle $\theta$ and a light intensity of the blue light at the any non-zero exiting angle $\theta$, $R(x_{R\theta}, y_{R\theta})$, $G(x_{G\theta}, y_{G\theta})$ and $B(x_{B\theta}, y_{B\theta})$ respectively represent a chromaticity value of the red light at the any non-zero exiting angle $\theta$, a chromaticity value of the green light at the any non-zero exiting angle $\theta$ and a chromaticity value of the blue light at the any non-zero exiting angle $\theta$, $W(x_{w\theta}, y_{w\theta})$ represents a chromaticity coordinate of white light formed by mixing the red light, the green light and the blue light at the any non-zero exiting angle θ, and W(x_{wθ}, y_{wθ}) is same as a chromaticity coordinate of white light at the exiting angle of 0°.

For example, in the manufacturing method of the organic light-emitting display panel provided by at least one embodiment of the present disclosure, the light transmittance of the first color filter layer at the any non-zero exiting angle θ, the light transmittance of the second color filter layer at the any non-zero exiting angle θ and the light transmittance of the third color filter layer at the any non-zero exiting angle θ are determined as follows: determining brightness required by the red light at the any non-zero exiting angle θ, brightness required by the green light at the any non-zero exiting angle θ and brightness required by the blue light at the any non-zero exiting angle θ according to the light intensity ratio of the red light, the green light and the blue light at the any non-zero exiting angle θ; and determining the light transmittance value of the first color filter layer in condition that the light exits from the first color filter layer at the any non-zero exiting angle of θ, the light transmittance value of the second color filter layer in condition that the light exits from the second color filter layer at the any non-zero exiting angle θ and the light transmittance value of the third color filter layer in condition that the light exits from the second color filter layer at the any non-zero exiting angle θ based on a brightness attenuation curve of the red light with respect to the any non-zero exiting angle θ, a brightness attenuation curve of the green light with respect to the any non-zero exiting angle θ, a brightness attenuation curve of the blue light with respect to the any non-zero exiting angle θ, brightness of the red light emitted by the first light-emitting element, brightness of the green light emitted by the second light-emitting element, brightness of the blue light emitted by the third light-emitting element and brightness required at the any non-zero exiting angel θ.

For example, in the manufacturing method of the organic light-emitting display panel provided by at least one embodiment of the present disclosure, a thickness $H_{θ1}$ of the first color filter layer at the any non-zero exiting angle θ satisfies:

$$H_{θ1}=H_0 \cdot \cos θ \cdot \log_{T_{01}} T_{θ1},$$

in which $H_0$ represents the central thickness, θ represents the any non-zero exiting angle, $T_{01}$ represents the light transmittance value of the first color filter layer in condition that the light exits from the first color filter layer at the exiting angle of 0°, and $T_{θ1}$ represents a light transmittance value of the first color filter layer in condition that the light exits from the first color filter layer at the any non-zero exiting angle of θ;

a thickness $H_{θ2}$ of the second color filter layer at the any non-zero exiting angle θ satisfies:

$$H_{θ2}=H_0 \cdot \cos θ \cdot \log_{T_{02}} T_{θ2},$$

in which $H_0$ represents the central thickness, θ represents the any non-zero exiting angle, $T_{02}$ represents the light transmittance value of the second color filter layer in condition that the light exits from the second color filter layer at the exiting angle of 0°, and $T_{θ2}$ represents the light transmittance value of the second color filter layer in condition that the light exits from the second color filter layer at the any non-zero exiting angle of θ;

a thickness $H_{θ3}$ of the third color filter layer at the any non-zero exiting angle θ satisfies:

$$H_{θ3}=H_0 \cdot \cos θ \cdot \log_{T_{03}} T_{θ3},$$

in which $H_{03}$ represents the central thickness, θ represents the any non-zero exiting angle, $T_{03}$ represents the light transmittance value of the third color filter layer in condition that the light exits from the third color filter layer at the exiting angle of 0°, and $T_{θ3}$ represents a light transmittance value of the third color filter layer in condition that the light exits from the third color filter layer at the any non-zero exiting angle of θ.

At least one embodiment of the present disclosure further provides an organic light-emitting display device, and the organic light-emitting display device comprises any one of the organic light-emitting display panels mentioned above and a casing; the casing comprises a back casing which defines an accommodating space and a side frame, the organic light-emitting display panel is inside the accommodating space, and a light exiting side of the organic light-emitting display panel is on a side of the organic light-emitting display panel facing away from the back casing.

The organic light-emitting display panel and the organic light-emitting display device based on the COE technology have a problem of view angle chromaticity deviation in directions of different view angles. Therefore, the present organic light-emitting display panel, the manufacturing method of the organic light-emitting display panel and the organic light-emitting display device are still required to be improved.

BRIEF DESCRIPTION OF THE DRAWINGS

In order to clearly illustrate the technical solution of the embodiments of the present disclosure, the drawings of the embodiments will be briefly described in the following. It is apparent that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprise," "comprising," "include," "including," etc., are intended to specify that the elements or the objects stated before these terms encompass the elements or the objects listed after these terms as well as equivalents thereof, but do not exclude other elements or objects. The terms "on," "under," "left," "right" and the like are only used to indicate relative position relationship, and in a case that the position of an object is described as being changed, the relative position relationship may be changed accordingly.

Figure 1:
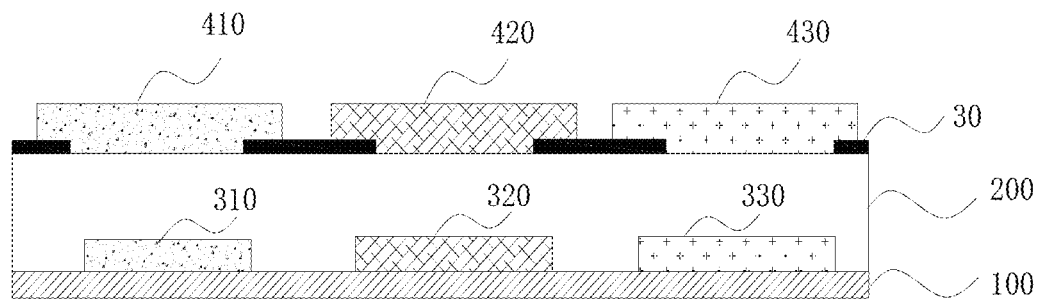
FIG. 1 is a schematic cross-sectional structural view of an organic light-emitting display panel.

FIG. 1 is a schematic cross-sectional structural view of an organic light-emitting display panel, as illustrated in FIG. 1, the organic light-emitting display panel includes a substrate 100 and light-emitting elements disposed on the substrate 100. The organic light-emitting display panel is described by taking that the light-emitting elements include a light-emitting element that emit red light, a light-emitting element that emit green light and a light-emitting element that emit blue light as an example, that is, the light-emitting elements at least include a red light-emitting element 310, a green light-emitting element 320 and a blue light-emitting element 330. An encapsulation structure 200 is disposed on the red light-emitting element 310, the green light-emitting element 320 and the blue light-emitting element 330, and color filter layers are disposed on the encapsulation structure 200 which covers the light-emitting elements, that is, the color filter layers are on a side, which is away from the substrate 100, of the encapsulation structure 200. The color filter layers include a red layer 410, a green layer 420 and a blue layer 430; the red layer 410 is disposed right above the red light-emitting element 310, the green layer 420 is disposed right above the green light-emitting element 320, and the blue layer 420 is disposed right above the blue light-emitting element 320. For example, a black matrix 30 is disposed between the red layer 410 and the green layer 420 that are adjacent to each other, between the green layer 420 and the blue layer 430 that are adjacent to each other, and between the red layer 410 and the blue layer 430 that are adjacent to each other.

For example, as illustrated in FIG. 1, a thickness of the red layer 410, a thickness of the green layer 420, and a thickness of the blue layer 430 are substantially equal to each other. For example, all of a surface of the red layer 410, a surface of the green layer 420 and a surface of the blue layer 430 are flat surfaces and have substantially a same thickness. Because an absorption coefficient of the red layer 410, an absorption coefficient of the green layer 420 and an absorption coefficient of the blue layer 430 are different from each other, light emitted from the red layer 410, light emitted from the green layer 420 and light emitted from the blue layer 430 have view angle chromaticity deviations at different view angles. That is, there is a difference in chromaticity between light emitted at a large view angle and light emitted at a perpendicular view (an exiting angle of the light is 0°), and the term "an exiting angle of the light is 0° " refers to that an included angle between a light exiting direction and a center line of the red layer 410, or an included angle between the light exiting direction and a center line of the green layer 420, or an included angle between the light exiting direction and a center line of the blue layer 430 is 0°.

Figure 2:
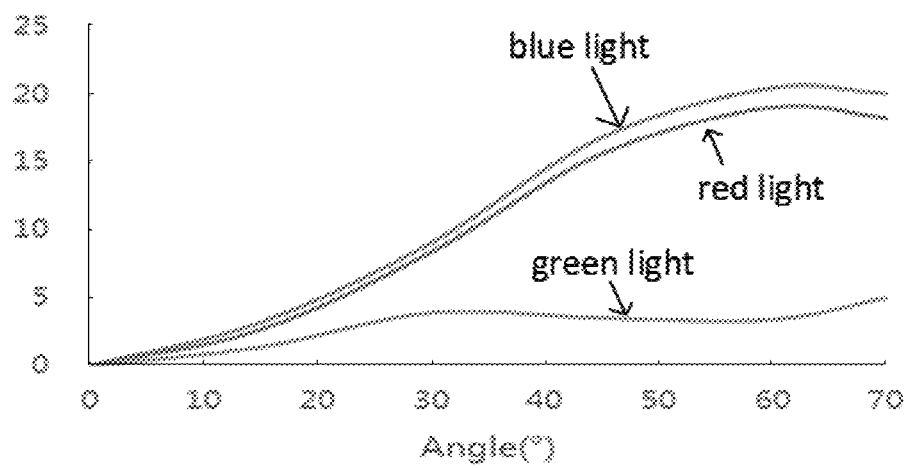
FIG. 2 is a graph showing chromaticity deviation curves of light of different colors at different exiting angles.

For example, FIG. 2 is a graph showing chromaticity deviation curves of light of different colors at different exiting angles. As illustrated in FIG. 2, all the red light, the green light and the blue light have more and more serious chromaticity deviation with the increase of the exiting angle, for example, from 0 degree to 70 degree, that is, a range of chromaticity change increases; the chromaticity deviation degrees of light of different colors are different, and the chromaticity deviation degree of the red light and the chromaticity deviation degree of the blue light increase with the increase of the exiting angle are more serious than that of the green light. Therefore, white light formed by mixing the red light, the green light and the blue light also has a serious problem of view angle chromaticity deviation. The white light is a reference for mixing light of other colors, therefore adjusting the white light is an important method to prevent the view angle chromaticity deviation.

After an in-depth research and a large number of experiments the inventors of the present disclosure found that with the change of the view angle of the exiting light, the change of the chromaticity of the red light is related to the structure of the red light-emitting element itself, the change of the chromaticity of the green light is related to the structure of the green light-emitting element itself, and the change of the chromaticity of the blue light is related to the structure of the blue light-emitting element itself. For example, it is related to the characteristics of structures, such as a light-emitting diode included in the red light-emitting element, the green light-emitting element or the blue light-emitting element, and the encapsulation structure 200, and so on. A path of the red light passing through the red layer (including a length of the path and a bending degree of the path), a path of the green light passing through the green layer, and a path of the blue light passing through the blue layer have little influence on the chromaticity deviation. In addition to the above chromaticity deviation, all of brightness of the red light, brightness of the green light and brightness of the blue light also attenuate with the increase of the exiting angle.

Figure 3:
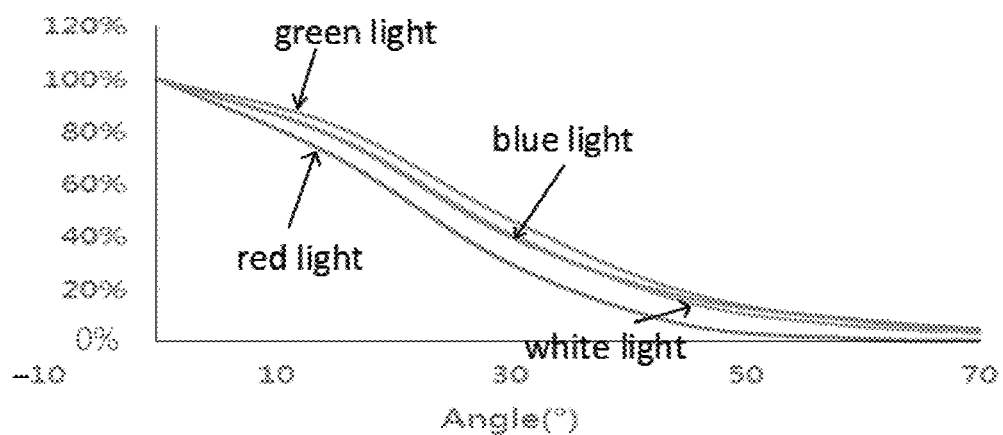
FIG. 3 is a graph showing brightness attenuation curves of the light of different colors with an increase of the exiting angle.

For example, FIG. 3 is a graph showing brightness attenuation curves of light of different colors with the increase of the exiting angle. As illustrated in FIG. 3, as the view angle increases, all the brightness of the red light, the brightness of the green light and the brightness of the blue light decrease. Referring to an ordinate in FIG. 3, in a case that the exiting angle is larger than 0°, brightness of the exiting light attenuates relative to the brightness of the exiting light in a case that the exiting angle is 0°. In a case that the exiting angle is 0°, the brightness of the exiting light is 100%, the brightness does not attenuate; in a case that the exiting angle increases to 30 degrees, the brightness of the red light attenuates to about 25% of the brightness of the exiting light in a case that the exiting angle is 0°, the brightness of the green light attenuates to about 45% of the brightness of the exiting light in a case that the exiting angle is 0°, and the brightness of the blue light attenuates to about 40% of the brightness of the exiting light in a case that the exiting angle is 0°. With the increase of the view angle, the brightness attenuation of the red light, the brightness attenuation of the green light and the brightness attenuation of the blue light are different. The brightness attenuation of the red light is the fastest with the increase of the view angle, and the brightness attenuation of the green light is the slowest with the increase of the view angle, while a brightness attenuation curve of the blue light substantially coincide with a brightness attenuation curve of white light formed by mixing the red light, the green light and the blue light. However, the brightness attenuation of light of different colors can be adjusted by adjusting thicknesses of the color filter layers corresponding to the light of different colors, that is, adjusting the paths of the light of different colors passing through the corresponding color filter layers under different view angles. Moreover, those skilled in the art are familiar with a fact that light intensities of monochromatic light of different colors and a ratio of light intensities of different colors of monochromatic light that are mixed to form the white light affect the chromaticity of the white light formed by mixing the red light, the green light and the blue light. Therefore, the chromaticities of the white light formed by different mixed colors can be substantially consistent by adjusting the thickness of the red color filter layer, the thickness of the green color filter layer and the thickness of the blue color filter layer at different exiting angles and controlling the light intensity of the red light, the light intensity of the green light and the light intensity of the blue light at various view angles according to the chromaticity deviations (color coordinates) of the light of the three different colors which are the red light, the green light and the blue light at different exiting angles and color coordinates of the white light to be obtained. That is to say, for light with a fast brightness attenuation speed under a large exiting angle, such as the red light, a light transmittance of the red layer is reduced greatly under the large exiting angle, that is, an optical path of the red light is shorten, a surface, which is away from the substrate, of the red layer is a convex surface; at the same time, for light with a slow brightness attenuation speed under a large exiting angle, such as the green light, an optical path of the green light under the large exiting angle is lengthen, a surface, which is away from the substrate, of the green layer is a concave surface to increase the optical path, and the attenuation speed of the green light is accelerated accordingly, so that the chromaticities of the white light formed by mixing the light emitted at different exiting angles are finally substantially consistent.

At least one embodiment of the present disclosure provides an organic light-emitting display panel, and the organic light-emitting display panel comprises: a substrate, a first light-emitting element and a second light-emitting element that are on the substrate; a first color filter layer on a light exiting side of the first light-emitting element and a second color filter layer on a light exiting side of the second light-emitting element, in which a color of light emitted by the first light-emitting element is different from a color of light emitted by the second light-emitting element; the color of the light emitted by the first light-emitting element is same as a color of the first color filter layer, and the color of the light emitted by the second light-emitting element is same as a color of the second color filter layer; with an increase of an exiting angle, a brightness attenuation speed of the light emitted by the first light-emitting element is faster than a brightness attenuation speed of the light emitted by the second light-emitting element, and the exiting angle is an included angle between exiting light and a normal perpendicular to the substrate; and the first color filter layer has a first convex surface protruding toward a side away from the first light-emitting element, and the first convex surface is on a side of the first color filter layer away from the first light-emitting element; and/or the second color filter layer has a first concave surface recessed toward a side close to the second light-emitting element, and the first concave surface is on a side of the second color filter layer away from the second light-emitting element. The color filter layers corresponding to the light-emitting elements emitting light of different colors of the organic light-emitting display panel have specific shapes, so that light paths of the light emitted by the light-emitting elements emitting light of different colors when passing through the corresponding color filter layers can be adjusted, and thus light intensities of the light of different colors when actually exits after passing through the corresponding color filter layers can be adjusted, so that the chromaticities of white light exits at different view angles after color mixing can be substantially consistent. Therefore, the problem that the organic light-emitting display panel has view angle chromaticity deviation at different view angles is alleviated.

Figure 4:
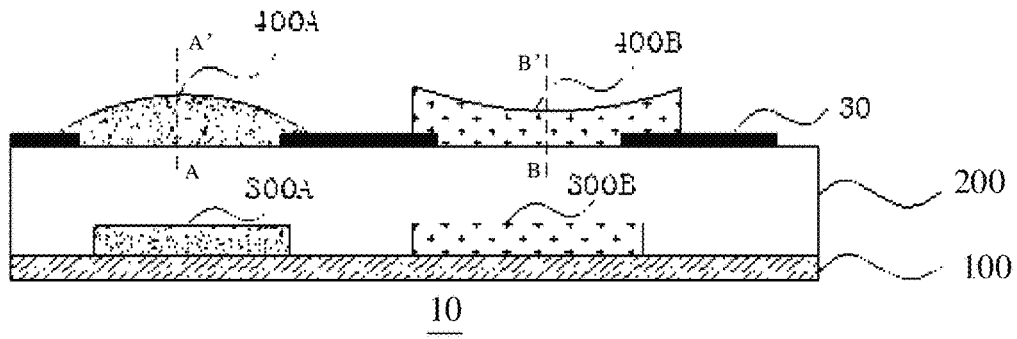
FIG. 4 is a schematic cross-sectional structural diagram of an organic light-emitting display panel provided by an embodiment of the present disclosure.

FIG. 4 is a schematic cross-sectional structural diagram of an organic light-emitting display panel provided by an embodiment of the present disclosure. As illustrated in FIG. 4, the organic light-emitting display panel comprises a substrate 100, a first light-emitting element 300A and a second light-emitting element 300B that are on the substrate 100, a first color filter layer 400A on a light exiting side of the first light-emitting element 300A and a second color filter layer 400B on a light exiting side of the second light-emitting element 300B; a color of light emitted by the first light-emitting element 300A is different from a color of light emitted by the second light-emitting element 300B; the color of the light emitted by the first light-emitting element 300A is same as a color of the first color filter layer 400A, the color of the light emitted by the second light-emitting element 300B is same as a color of the second color filter layer 400B; with an increase of an exiting angle, a brightness attenuation speed of the light emitted by the first light-emitting element 300A is faster than a brightness attenuation speed of the light emitted by the second light-emitting element 300B, and the exiting angle is an included angle between exiting light and a normal perpendicular to the substrate; the first color filter layer 400A has a first convex surface protruding toward a side away from the first light-emitting element 300A on a side, which is away from the first light-emitting element 300A, of the first color filter layer 400A, and the second color filter layer 400B has a first concave surface recessed toward a side close to the second light-emitting element 300B on a side, which is away from the second light-emitting element 300B, of the second color filter layer 400B.

For example, as illustrated in FIG. 4, an encapsulation structure 200 is disposed on the first light-emitting element 300A and the second light-emitting element 300B. The first color filter layer 400A and the second color filter layer 400B are on the encapsulation structure 200 which covers the first light-emitting element 300A and the second light-emitting element 300B, that is, the first color filter layer 400A is on a side, which is away from the substrate 100, of the encapsulation structure 200 and right above the first light-emitting element 300A, and the second color filter layer 400B is on a side, which is away from the substrate 100, of the encapsulation structure 200 and right above the second light-emitting element 300B. A black matrix 30 is disposed between the first color filter layer 400A and the second color filter layer 400B which are adjacent to each other.

For example, the first light-emitting element 300A is a yellow light-emitting element, and the first color filter layer 400A is a yellow color filter layer; the second light-emitting element 300B is a blue light-emitting element, and the second color filter layer 400B is a blue color filter layer. For example, a side, which is away from the yellow light-emitting element, of the yellow color filter layer has a convex surface protruding toward a side away from the yellow light-emitting element; a side, which is away from the blue light-emitting element, of the blue color filter layer has a concave surface that is concave toward a side close to the blue light-emitting element, which are not limited in the embodiments of the present disclosure, as long as the light formed by color mixing is white light.

It should be noted that, in FIG. 4, the organic light-emitting display panel is described by taking that the first color filter layer 400A has the first convex surface protruding toward the side away from the first light-emitting element 300A on the side, which is away from the first light-emitting element 300A, of the first color filter layer 400A, and the second color filter layer 400B has the first concave surface recessed toward the side close to the second light-emitting element 300B on the side, which is away from the second light-emitting element 300B, of the second color filter layer 400B as an example. In other examples, it may be that the first color filter layer 400A has a convex surface protruding toward the side away from the first light-emitting element 300A on a side, which is away from the first light-emitting element 300A, of the first color filter layer 400A, and the second color filter layer 400B has a flat surface on a side, which is away from the second light-emitting element 300B, of the second color filter layer 400B; the first color filter layer 400A has a flat surface on the side, which is away from the first light-emitting element 300A, of the first color filter layer 400A, and the side of the second color filter layer 400B away from the second light-emitting element 300B has a concave surface recessed toward the side close to the second light-emitting element 300B, which are not limited in the embodiment of the present disclosure.

It should also be noted that, although only two light-emitting elements which are the first light-emitting element 300A and the second light-emitting element 300B are illustrated in FIG. 4, the organic light-emitting display panel further includes more light-emitting elements, the colors of the plurality of light-emitting elements are not completely the same, and the light exiting side of each of the light-emitting elements (taking that a side away from the substrate 100 illustrated in FIG. 4 as an example) has a color filter layer whose color is same as the color of light emitted by the light-emitting element. The organic light-emitting display panel can adjust light paths of light emitted by the plurality of the light-emitting elements when passing through respective corresponding color filter layers by adjusting a shape of at least a portion of the color filter layer away from the surface of the substrate 100, so as to further adjust the intensity of light of different colors when actually emitted after passing through the respective corresponding color filter layers, so that chromaticities of white light formed by mixing light emitted at different view angles can be substantially consistent. Therefore, the problem that the organic light-emitting display panel has view angle chromaticity deviation at different view angles is alleviated or eliminated.

For example, as illustrated in FIG. 4, the first color filter layer 400A has a first convex surface, that is, a surface, which is away from the substrate 100, of the first color filter layer 400A, protrudes toward the side away from the substrate 100, the first convex surface of the first color filter layer 400A has a first symmetrical center A-A', and an exiting angle of light emitted by the first light-emitting element 300A at the first symmetrical center A-A' is 0°; the second color filter layer 400B has a first concave surface, that is, a surface, which faces away from the substrate 100, of the second color filter layer 400B is recessed toward the substrate 100, the first concave surface of the second color filter layer 400B has a second symmetrical center B-B', and an exiting angle of light emitted by the second light-emitting element 300B at the second symmetrical center B-B' is 0°.

For example, as illustrated in FIG. 4, a thickness of the first color filter layer 400A at the first symmetrical center A-A' of the first convex surface is equal to a thickness of the second color filter layer 400B at the second symmetrical center B-B' of the first concave surface, and both the thickness of the first color filter layer 400A at the first symmetrical center A-A' of the first convex surface and the thickness of the second color filter layer 400B at the second symmetrical center B-B' of the first concave surface are a central thickness; the thickness of the first color filter layer 400A gradually decreases from the first symmetrical center A-A' of the first convex surface of the first color filter layer 400A to two opposite edges of the first convex surface; the thickness of the second color filter layer 400B gradually increases from the second symmetrical center B-B' of the first concave surface of the second color filter layer 400B to two opposite edges of the first concave surface.

For example, the thickness of the first color filter layer 400A and the thickness of the second color filter layer 400B are configured such that a light intensity of white light formed by mixing monochromatic light emitted from the first color filter layer 400A at any non-zero exiting angle and monochromatic light emitted from the second color filter layer 400B at the any non-zero exiting angle is same as a light intensity of white light with an exiting angle of 0°.

Figure 5:
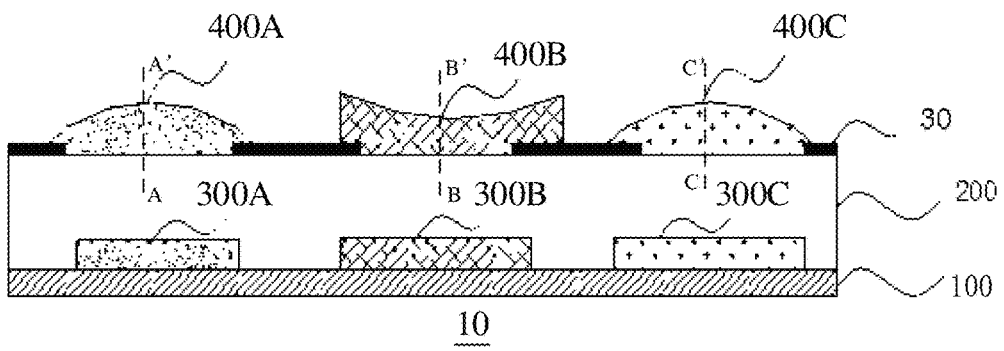
FIG. 5 is a schematic cross-sectional structural diagram of another organic light-emitting display panel provided by an embodiment of the present disclosure.

FIG. 5 is a schematic cross-sectional structural diagram of another organic light-emitting display panel provided by an embodiment of the present disclosure, a difference between the organic light-emitting display panel illustrated in FIG. 5 and the organic light-emitting display panel illustrated in FIG. 4 is that the organic light-emitting display panel illustrated in FIG. 5 further comprises a third light-emitting element 300C and a third color filter layer 400C; the third color filter layer 400C is on an light exiting side of the third light-emitting element 300C, and the third color filter layer 400C is right above the third light-emitting element 300C; a color of light emitted by the third light-emitting element 300C is different from both the color of the light emitted by the first light-emitting element 300A and the color of the light emitted by the second light-emitting element 300B; the color of the light emitted by the third light-emitting element 300C is same as a color of the third color filter layer 400C; with the increase of the exiting angle, a brightness attenuation speed of the light emitted by the third light-emitting element 300C is between the brightness attenuation speed of the light emitted by the first light-emitting element 300A and the brightness attenuation speed of the light emitted by the second light-emitting element 300B; the third color filter layer 400C has a second convex surface protruding toward a side away from the third light-emitting element 300C on a side, which is away from the third light-emitting element 300C, of the third color filter layer 400C.

It should be noted that, although the third color filter layer 400C illustrated in FIG. 5 has the second convex surface protruding toward the side away from the third light-emitting element 300C on a side, which is away from the third light-emitting element 300C, of the third color filter layer 400C, in other embodiments, for example, the third color filter layer 400C has a second concave surface recessed toward a side close to the third light-emitting element 300C, or the third color filter layer 400C has a flat surface, which are not limited in the embodiment of the present disclosure.

For example, as illustrated in FIG. 5, the first light-emitting element 300A, the second light-emitting element 300B, and the third light-emitting element 300C that are included in the light-emitting elements of the organic light-emitting display panel are respectively a red light-emitting element, a green light-emitting element and a blue light-emitting element; the red light-emitting element is configured for emitting red light, the green light-emitting element is configured for emitting green light, and the blue light-emitting element is configured for emitting blue light. For example, the first color filter layer 400A, the second color filter layer 400B and the third color filter layer 400C are respectively a red color filter layer, a green color filter layer and a blue color filter layer. Specifically, for example, the red color filter layer on the light exiting side of the red light-emitting element has the first convex surface, the green color filter layer on the light exiting side of the green light-emitting element has the first concave surface, and the blue color filter layer on the light exiting side of the blue light-emitting element has the second convex surface. Therefore, a shape of a surface of the red color filter layer which is away from the substrate 100, a shape of a surface of the green color filter layer which is away from the substrate 100, and a shape of a surface of the blue color filter layer which is away from the substrate 100 are determined according to specific attenuation conditions of the red light, the green light and the blue light respectively, so as to control lengths of light paths of the light of different colors in the color filter layers of respective corresponding colors to be different, and thus the chromaticities of the white light formed by mixing the light emitted at different view angles are substantially consistent.

It should be specially noted that, in the present disclosure, the terms "exiting angle" and "degree of the (an) exiting angle" refer to an included angle of the light and a normal direction when the light of different colors emitted by different light-emitting elements exit from the color filter layers corresponding to the respective light-emitting elements, and the normal is perpendicular to a main plane of the substrate. In other words, an exiting angle (a degree of an exiting angle) of 0° means that the light is emitted in a direction perpendicular to the substrate 100. Terms such as "convex surface" and "protruding" specifically refer to the surface of the color filter layer away from the substrate protrudes toward the side away from the light-emitting element; terms such as "concave surface" and "recessed" specifically refer to the surface of the color filter layer close to the substrate recesses toward the light-emitting element.

According to the embodiment of the present disclosure, controlling the lengths of the light paths that the light passes through in its corresponding color filter layer at different exiting angles means controlling the thickness of the color filter layer to be different at different positions. Because both a chromaticity deviation curve and a brightness attenuation curve of monochromatic light are smooth curves, and in order to simplify a manufacturing process of the color filter layer, a surface on the light exiting side of the color filter layer (for example, the surface of the color filter away from the light-emitting element) is in a shape of an arc with a symmetrical center. Therefore, the color filter layers with different lengths of light paths at different light exiting angles are obtained by controlling a curvature of the arc. According to the embodiments of the present disclosure, the thickness of each of the color filter layers is in a range of 0.5 micron to 5 microns, and both a curvature of the convex surface and a curvature of the concave surface are less than 0.036. In a case where the thickness of each of the color filter layers is within the above range, and both the curvature of the convex surface and the curvature of the concave surface are within the above range, on one hand, it can be ensured that the thicknesses of the plurality of the color filter layers cannot make the surfaces of the color filter layers uneven due to the surfaces of the color filter layers are in different shapes, and the overall flatness of the display panel is not influenced. On the other hand, it can also be ensured that the convex surface or the concave surface can alleviate the problem of color deviation of view angles at different light exiting angles.

According to some embodiments of the present disclosure, both the convex surface and the concave surface have symmetrical centers, and the exiting angle of light at each of the symmetrical centers is 0°. That is, the convex surface of the color filter layer comprises a section of symmetrical curved surface, the symmetrical center is located at a central position of the convex surface or a central position of the concave surface of the color filter layer, and a tangent direction of the curved surface at the central position is parallel to a plane in which the substrate is located. A thickness of the convex surface at the symmetrical center is equal to a thickness of the concave surface at the symmetrical center, and both the thickness of the convex surface at the symmetrical center and the thickness of the concave surface at the symmetrical center are a central thickness, that is a known fixed value. That is, in FIG. 5, a thickness of the third color filter layer 400C at a third symmetrical center of the the second convex surface, a thickness of the first color filter layer 400A at a first symmetrical center of the first convex surface and a thickness of the second color filter layer 400B at a second symmetrical center of the first concave surface are equal to each other, and all of which are the central thickness. The thickness of the first color filter layer 400A gradually decreases from the first symmetrical center of the first convex surface of the first color filter layer 400A to two opposite edges of the first color filter layer 400A at two sides of the first symmetrical center of the first color filter layer 400A; the thickness of the second color filter layer 400B gradually increases from the second symmetrical center of the first concave surface of the second color filter layer 400B to two opposite edges of the second color filter layer 400B respectively at two sides of the second symmetrical center of the second color filter layer 400B; and the thickness of the third color filter layer 400A gradually decreases from the third symmetrical center of the the second convex surface of the third color filter layer 400C to two opposite edges of the third color filter layer 400C at two sides of the third symmetrical center of the third color filter layer 400C. Therefore, on the one hand, all the first color filter layer 400A, the second color filter layer 400B and the third color filter layer 400C have relatively regular shapes, which is convenient for the preparation thereof, and on the other hand, the symmetrical shapes are also convenient for determining parameters such as a height of the first color filter layer 400A, a height of the second color filter layer 400B and a height of the third color filter layer 400C at different positions, so that the chromaticities of white light formed by mixing light emitted at different angles are substantially consistent.

According to the embodiments of the present disclosure, the central thickness is a known fixed value, the central thickness and the thicknesses of each of the color filter layers at different positions are configured such that a light intensity of white light formed by mixing monochromatic light emitted from each of the color filter layers at any non-zero exiting angle is same as a light intensity of white light with an exiting angle of 0°. Specifically, a thickness $H_\theta$ of each of the color filter layers at the any non-zero exiting angle $\theta$ satisfies a formula as follows:

$$H_\theta = H_0 \cdot \cos\theta \cdot \log_{T_0} T_\theta,$$

in which $H_0$ represents the central thickness, $\theta$ represents the any non-zero exiting angle, $T_0$ represents a light transmittance value of the first color filter layer, the second color filter layer or the third color filter layer in condition that light exits from the first color filter layer, the second color filter layer or the third color filter layer at the exiting angle of 0°, and $T_\theta$ represents a light transmittance value of the first color filter layer, the second color filter layer or the third color filter layer in condition that light exits from the first color filter layer, the second color filter layer or the third color filter layer at the any non-zero exiting angle of $\theta$.

For example, a thickness $H_{\theta 1}$ of the first color filter layer at the any non-zero exiting angle of $\theta$ satisfies:

$$H_{\theta 1} = H_0 \cdot \cos\theta \cdot \log_{T_{01}} T_{\theta 1},$$

in which $H_0$ represents the central thickness, $\theta$ represents the any non-zero exiting angle, $T_{01}$ represents a light transmittance value of the first color filter layer in condition that the light exits from the first color filter layer at the exiting angle of 0°, and $T_{\theta 1}$ represents a light transmittance value of the first color filter layer in condition that the light exits from the first color filter layer at the any non-zero exiting angle of $\theta$.

For example, a thickness $H_{\theta 2}$ of the second color filter layer at the any non-zero exiting angle of $\theta$ satisfies:

$$H_{\theta 2} = H_0 \cdot \cos\theta \cdot \log_{T_{02}} T_{\theta 2},$$

in which $H_0$ represents the central thickness, $\theta$ represents the any non-zero exiting angle, $T_{02}$ represents the light transmittance value of the second color filter layer in condition that the light exits from the second color filter layer at the exiting angle of 0°, and $T_{\theta 2}$ represents a light transmittance value of the second color filter layer in condition that the light exits from the second color filter layer at the any non-zero exiting angle of $\theta$.

For example, a thickness $H_{\theta 3}$ of the third color filter layer at the any non-zero exiting angle of $\theta$ satisfies:

$$H_{\theta 3} = H_0 \cdot \cos\theta \cdot \log_{T_{03}} T_{\theta 3},$$

in which $H_0$ represents the central thickness, $\theta$ represents the any non-zero exiting angle, $T_{03}$ represents the light transmittance value of the third color filter layer in condition that the light exits from the third color filter layer at the exiting angle of 0°, and $T_{\theta 3}$ represents a light transmittance value of the third color filter layer in condition that the light exits from the third color filter layer at the any non-zero exiting angle of $\theta$.

Those skilled in the art should understand that, after materials of the color filter layers with different colors are determined, the transmittance value of each of the color filter layers with different colors and the thickness of the corresponding color filter layer are interrelated with each other, and the transmittance value of light is only related to the thickness of the corresponding color filter layer. However, because the brightness of monochromatic light of different colors is attenuated after passing through the corresponding color filter layer, the brightness attenuations of the light at different exiting angles are different, and the light attenuation of each of the colors is determined by the brightness attenuation curves of the light of different colors at different exiting angles. For the organic light-emitting display panel, after the light-emitting elements included in the organic light-emitting display panel are selected, the light-emitting brightness of each of the light-emitting elements is also known. Therefore, based on a principle that the light intensity of the white light after color mixing is consistent with the light intensity of the white light at the exiting angle of 0°, and based on the brightness attenuation curves, a light intensity ratio of monochromatic light (such as red light, green light and blue light) of various colors emitted after the brightness attenuation meets the requirement of a consistent chromaticity of the white light formed after color mixing by adjusting the light transmittance of the color filter layers of various colors at different exiting angles. That is, based on the above known parameters, the light transmittance value $T_\theta$ of each of the color filter layers with different colors in a direction that the any non-zero exiting angle is $\theta$ is determined firstly, so that a color coordinate of white light formed by color mixing after the red light, the green light and the blue light are emitted after passing through the corresponding color filter layers in the direction where the any non-zero exiting angle is $\theta$ is same as a color coordinate of the white light formed by mixing the red light, the green light and the blue light that are emitted at the corresponding symmetrical center. That is, the $T_{\theta 1}$ of the first color filter layer, the $T_{\theta 2}$ of the second color filter layer and the $T_{\theta 3}$ of the third color filter layer are configured to allow that the chromaticity coordinate of white light formed by mixing the red light which is emitted at the any non-zero exiting angle $\theta$ after passing through the first color filter layer, the green light which is emitted at the any non-zero exiting angle $\theta$ after passing through the second color filter layer, and the blue light which is emitted at the any non-zero exiting angle $\theta$ after passing through the third color filter layer is same as the chromaticity coordinate of white light formed by mixing the red light which is emitted at the first symmetrical center of the first color filter layer, the green light which is emitted at the second symmetrical center of the second color filter layer and the blue light which is emitted at the third symmetrical center of the third color filter layer.

For example, as illustrated in FIG. 5, the third color filter layer 400C has the second convex surface, and a curvature of the second convex surface of the third color filter layer 400C is smaller than a curvature of the first convex surface of the first color filter layer 400A.

For example, in another example, the third color filter layer 400C has the second concave surface, and a curvature of the second concave surface of the third color filter layer 400C is smaller than a curvature of the first concave surface of the second color filter layer 400B.

For example, in another example, the third color film layer 400C has a flat surface.

For example, in the embodiments of the present disclosure, all of a thickness of the first color filter layer 400A, a thickness of the second color filter layer 400B, and the thickness of the third color filter layer 400C are in a range of 0.5 micron to 5 microns. Both a curvature of the first convex surface included in the first color filter layer 400A and a curvature of the second convex surface included in the third color filter layer 400C are less than 0.036, and a curvature of the first concave surface included in the second color filter layer 400B is less than 0.036.

For example, the $T_{\theta 1}$ of the first color filter layer 400A, the $T_{\theta 2}$ of the second color filter layer 400B and the $T_{\theta 3}$ of the third color filter layer 400C are configured to allow that the chromaticity coordinate of white light formed by mixing the red light which is emitted at the any non-zero exiting angle θ after passing through the first color filter layer 400A, the green light which is emitted at the any non-zero exiting angle θ after passing through the second color filter layer 400B, and the blue light which is emitted at the any non-zero exiting angle θ after passing through the third color filter layer 400C is same as the chromaticity coordinate of white light formed by mixing the red light which is emitted at the first symmetrical center of the first color filter layer 400A, the green light which is emitted at the second symmetrical center of the second color filter layer 400B and the blue light which is emitted at the third symmetrical center of the third color filter layer 400C.

At least one embodiment of the present disclosure further provides a method of manufacturing an organic light-emitting display panel, and the organic light-emitting display panel manufactured by the method has the same characteristics and advantages as the organic light-emitting display panel mentioned above.

Figure 6:
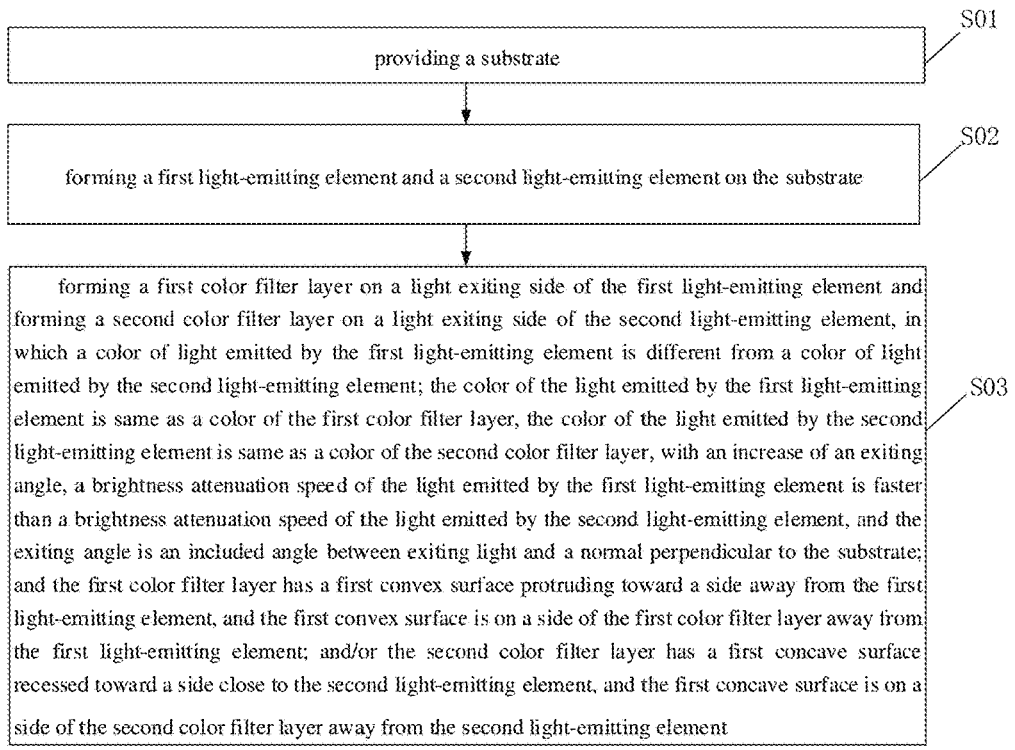
FIG. 6 is a flowchart of a manufacturing method of an organic light-emitting display panel provided by an embodiment of the present disclosure.

For example, FIG. 6 is a flowchart of a manufacturing method of an organic light-emitting display panel provided by an embodiment of the present disclosure. As illustrated in FIG. 6, the manufacturing method of the organic light-emitting display panel includes steps as follows.

S01: providing a substrate;

S02: forming a first light-emitting element and a second light-emitting element on the substrate;

S03: forming a first color filter layer on a light exiting side of the first light-emitting element and forming a second color filter layer on a light exiting side of the second light-emitting element, in which a color of light emitted by the first light-emitting element is different from a color of light emitted by the second light-emitting element; the color of the light emitted by the first light-emitting element is same as a color of the first color filter layer, the color of the light emitted by the second light-emitting element is same as a color of the second color filter layer, with an increase of an exiting angle, a brightness attenuation speed of the light emitted by the first light-emitting element is faster than a brightness attenuation speed of the light emitted by the second light-emitting element, and the exiting angle is an included angle between exiting light and a normal perpendicular to the substrate; and the first color filter layer has a first convex surface protruding toward a side away from the first light-emitting element, and the first convex surface is on a side of the first color filter layer away from the first light-emitting element; and/or the second color filter layer has a first concave surface recessed toward a side close to the second light-emitting element, and the first concave surface is on a side of the second color filter layer away from the second light-emitting element.

For example, in the organic light-emitting display panel manufactured by the above method, a light path of the light emitted by the first light-emitting element when passing through the first color filter layer is adjusted by the the first color filter layer, and a light path of the light emitted by the second light-emitting element when passing through the second color filter layer is adjusted by the the second color filter layer, then actual light intensities of the light with different colors after passing through the first color filter layer and the second color filter layer respectively are adjusted, thus, the chromaticities of white light formed by mixing the light emitted from different view angles are basically the same. Therefore, a problem that the organic light-emitting display panel has view angle chromaticity deviation at different view angles is alleviated. The principle of alleviating the problem of view angle chromaticity deviation of the color filter layer having the convex surface or the concave surface can refer to the relevant descriptions mentioned above, which are omitted herein.

Figure 7:
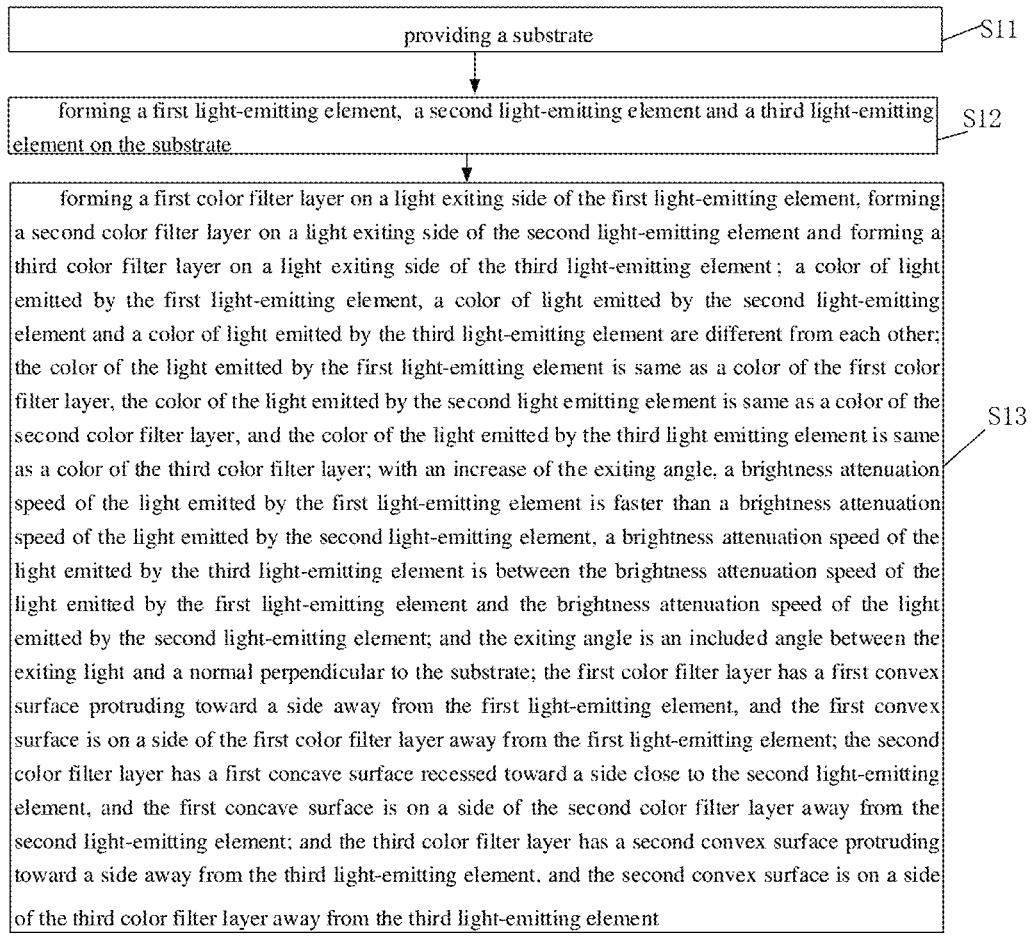
FIG. 7 is a flowchart of another manufacturing method of the organic light-emitting display panel provided by an embodiment of the present disclosure.

For example, FIG. 7 is a flowchart of another manufacturing method of the organic light-emitting display panel provided by an embodiment of the present disclosure. As illustrated in FIG. 7, the manufacturing method of the organic light-emitting display panel includes steps as follows.

S11: providing a substrate;

S12: forming a first light-emitting element, a second light-emitting element and a third light-emitting element on the substrate;

S13: forming a first color filter layer on a light exiting side of the first light-emitting element, forming a second color filter layer on a light exiting side of the second light-emitting element and forming a third color filter layer on a light exiting side of the third light-emitting element, in which a color of light emitted by the first light-emitting element, a color of light emitted by the second light-emitting element and a color of light emitted by the third light-emitting element are different from each other; the color of the light emitted by the first light-emitting element is same as a color of the first color filter layer, the color of the light emitted by the second light-emitting element is same as a color of the second color filter layer, and the color of the light emitted by the third light-emitting element is same as a color of the third color filter layer; with an increase of the exiting angle, a brightness attenuation speed of the light emitted by the first light-emitting element is faster than a brightness attenuation speed of the light emitted by the second light-emitting element, a brightness attenuation speed of the light emitted by the third light-emitting element is between the brightness attenuation speed of the light emitted by the first light-emitting element and the brightness attenuation speed of the light emitted by the second light-emitting element, and the exiting angle is an included angle between the exiting light and a normal perpendicular to the substrate; the first color filter layer has a first convex surface protruding toward a side away from the first light-emitting element, and the first convex surface is on a side of the first color filter layer away from the first light-emitting element; the second color filter layer has a first concave surface recessed toward a side close to the second light-emitting element, and the first concave surface is on a side of the second color filter layer away from the second light-emitting element; and the third color filter layer has a second convex surface protruding toward a side away from the third light-emitting element, and the second convex surface is on a side of the third color filter layer away from the third light-emitting element.

For example, a cross-sectional structure of the organic light-emitting display panel formed by the manufacturing method illustrated in FIG. 7 refers to FIG. 5. The first color filter layer 400A has the first convex surface, the first convex surface of the first color filter layer 400A has the first symmetric center A-A', and the exiting angle of light at the first symmetric center A-A' of the first convex surface is 0°, and forming the first color filter layer 400A having the first convex surface comprises: forming a first color resistance film on the light exiting side of the first light-emitting element 300A, etching the first color resistance film 300A based on a two-tone mask, and controlling light transmittance values at different positions of the two-tone mask to form the first color filter layer 400A, so that a thickness of the first color filter layer 400A at the first symmetrical center A-A' of the first convex surface is a central thickness, and the thickness of the first color filter layer 400A gradually decreases from the first symmetrical center A-A' of the first convex surface of the first color filter layer to two opposite edges of the first convex surface; the second color filter layer 400B has the first concave surface, the first concave surface of the second color filter layer 400B has a second symmetrical center B-B', and the exiting angle of the light emitted at the second symmetrical center B-B' of the first concave surface is 0°, and forming the second color filter layer having the first concave surface comprises: forming a second color resistance film on the light exiting side of the second light-emitting element, etching the second color resistance film based on a two-tone mask, and controlling light transmittance values at different positions of the two-tone mask to form the second color filter layer 400B, so that a thickness of the second color filter layer 400B at the second symmetrical center B-B' of the first concave surface is the central thickness, and the thickness of the second color filter layer 400B gradually increases from the second symmetrical center B-B' of the first concave surface of the second color filter layer 400B to two opposite edges of the first concave surface; the third color filter layer 400C has the second convex surface, the second convex surface of the third color filter layer 400C has a third symmetrical center C-C', and the exiting angle of light emitted at the third symmetrical center C-C' of the second convex surface is 0°, and forming the third color filter layer 400C having the second convex surface comprises: forming a third color resistance film on the light exiting side of the third light-emitting element 300C, etching the third color resistance layer based on a two-tone mask, and controlling light transmittance values at different positions of the two-tone mask to form the third color filter layer 400C, so that a thickness of the third color filter layer 400C at the third symmetrical center C-C' of the second convex surface is the central thickness, and the thickness of the third color filter layer 400C gradually decreases from the third symmetrical center C-C' of the second convex surface of the third color filter layer 400C to two opposite edges of the second convex surface.

For example, the manufacturing method of the organic light-emitting display panel is described by taking that the first light-emitting element 300A is a red light-emitting element configured to emit red light, the second light-emitting element 300B is a green light-emitting element configured to emit green light, and the third light-emitting element 300C is a blue light-emitting element configured to emit blue light as an example.

According to at least one embodiment of the present disclosure, in a case of manufacturing the first color filter layer, the second color filter layer, and the third color filter layer of the organic light-emitting display panel, a shape of the first color filter layer corresponding to the red light-emitting element, a shape of the second color film layer corresponding to the green light-emitting element, and a shape of the third color film layer corresponding to the blue light-emitting element are determined according to the brightness attenuation of the red light, the brightness attenuation of the green light, and the brightness attenuation of the blue light-emitting element (for example, referring to the brightness attenuation curves illustrated in FIG. 3). For example, it is determined that the surface of the first color filter layer on the side away from the first light-emitting element is the first convex surface, the surface of the second color filter layer on the side away from the second light-emitting element is the first concave surface, and the surface of the third color filter layer on the side away from the third light-emitting element is the second convex surface. In order to prevent thickness differences of any two of the first color filter layer, the second color filter layer and the third color filter layer finally formed in the organic light-emitting display panel from being too large to affect smoothness of the surface of the entire organic light-emitting display panel, the thickness of the first color filter layer at the first symmetrical center of the first convex surface, the thickness of the second color filter layer at the second symmetrical center of the first concave surface and the thickness of the third color filter layer at the third symmetrical center of the second convex surface are equal to each other. For example, all the thickness of the first color filter layer at the first symmetrical center of the first convex surface, the thickness of the second color filter layer at the second symmetrical center of the first concave surface and the thickness of the third color filter layer at the third symmetrical center of the second convex surface are the central thickness; and the thickness of the first color filter layer gradually decreases from the first symmetrical center of the first convex surface of the first color filter layer to two opposite edges of the first convex surface; the thickness of the second color filter layer gradually increases from the second symmetrical center of the first concave surface of the second color filter layer to two opposite edges of the first concave surface ; the thickness of the third color filter layer gradually decreases from the third symmetrical center of the second convex surface of the third color filter layer to two opposite edges of the second convex surface. In this way, the first color filter layer having the first convex surface, the second color filter layer having the first concave surface and the third color filter layer having the second convex surface are obtained simply.

In the following, steps of determining specific sizes (parameters such as the thicknesses, the curvatures, and so on) of the first color filter layer, the second color filter layer and the third color filter layer are described in details.

As mentioned above, both the chromaticity and the brightness of monochromatic light change with different exiting angles, and the attenuation of brightness is controlled by adjusting the light transmittance value of the first color filter layer at the exiting angle, the light transmittance value of the second color filter layer at the exiting angle and the light transmittance value of the third color filter layer at the exiting angle in addition to be related to the exiting angle. That is to say, by adjusting the length of the optical path of the light at a specific exiting angle, the brightness of the light emitted at the exiting angle is adjustable. However, the brightness of the monochromatic light and the ratio between the brightness of a plurality kinds of monochromatic light used for color mixing to form the white light can affect the chromaticity and the brightness of the white light after the color mixing. Therefore, it allows that the white light formed by the color mixing at different exiting angles maintains relatively consistent chromaticity, that is, the problem of view angle chromaticity deviation of the organic light-emitting display panel can be alleviated. Specifically, because no chromaticity deviation or brightness deviation exist at the exiting angle of 0°, it allows that the thickness of the first color filter layer at the first symmetrical center of the first convex surface, the thickness of the second color filter layer at the second symmetrical center of the first concave surface and the thickness of the third color filter layer at the third symmetrical center of the second convex surface are equal to each other and all of which are the central thickness, and the central thickness is determined according to a light intensity of the light emitted by the first light-emitting element of the organic light-emitting display panel, a light intensity of the light emitted by the second light-emitting element of the organic light-emitting display panel and a light intensity of the light emitted by the third light-emitting element of the organic light-emitting display panel, and according to requirements of an overall thickness of the organic light-emitting display panel, and the center thickness is a known fixed value. Then, the thickness of the first color filter layer, the thickness of the second color filter layer and the thickness of the third color filter layer at different exiting angles are determined, so that a light intensity of the red light emitted from the first color filter layer at different exiting angles, a light intensity of the green light emitted from the second color filter layer at different exiting angles, and a light intensity of the blue light emitted from the third color filter layer at different exiting angles satisfy that a light intensity of the white light formed after the color mixing (mixing the red light, the green light and the blue light) is same as that of white light at the exiting angle of 0°. In this way, the shapes and the thickness parameters of the first color filter layer, the second color filter layer and the third color filter layer are simply determined.

For example, a light intensity ratio of the red light, the green light and the blue light at the any non-zero exiting angle is determined based on a chromaticity value of the red light at the any non-zero exiting angle, a chromaticity value of the green light at the any non-zero exiting angle, a chromaticity value of the blue light at the any non-zero exiting angle, and a chromaticity value and a light intensity of the white light, which is formed by mixing the red light, the green light and the blue light, at the exiting angle of 0°. Then, according to brightness attenuation of the red light at the any non-zero exiting angle, brightness attenuation of the green light at the any non-zero exiting angle and brightness attenuation of the blue light at the any non-zero exiting angle, for example, referring to the curves illustrated in FIG. 3, the light transmittance value of the first color filter layer in condition that the light exits from the first color filter layer at the any non-zero exiting angle, the light transmittance value of the second color filter layer in condition that the light exits from the second color filter layer at the any non-zero exiting angle and the light transmittance value of the third color filter layer in condition that the light exits from the third color filter layer at the any non-zero exiting angle are determined, so that the red light after the brightness attenuation, the green light after the brightness attenuation and the blue light after the brightness attenuation satisfy the light intensity ratio of the red light, the green light and the blue light at the any non-zero exiting angle. Then the thickness of the first color filter layer, the thickness of the second color filter layer and the thickness of the third color filter layer are determined based on the light transmittance value of the first color filter layer in condition that the light exits from the first color filter layer at the any non-zero exiting angle, the light transmittance value of the second color filter layer in condition that the light exits from the second color filter layer at the any non-zero exiting angle and the light transmittance value of the third color filter layer in condition that the light exits from the third color filter layer at the any non-zero exiting angle: the thicker the thickness of the first color filter layer, the thickness of the second color filter layer or the thickness of the third color filter layer, the lower the light transmittance value of the first color filter layer, the light transmittance value of the second color filter layer or the light transmittance value of the third color filter layer correspondingly. In this way, the shapes and the thickness parameters of the first color filter layer, the second color filter layer and the third color filter layer are simply determined, which prevent the thickness differences among the first color filter layer having the first convex surface and the third color filter layer having the second convex surface and the second color filter layer having the first concave surface from being too large.

According to at least one embodiment of the present disclosure, taking that the light-emitting element includes the red light-emitting element, the green light-emitting element and the blue light-emitting element as an example, and the light intensity ratio of the red light, the green light and the blue light at the any non-zero exiting angle $\theta$, $L_{R\theta}$:$L_{G\theta}$:$L_{B\theta}$ is determined by a formula as follows:

$$\begin{cases} x_{w_\theta} = \dfrac{x_{R\theta} \cdot (L_{R\theta}/y_{R\theta}) + x_{G\theta} \cdot (L_{G\theta}/y_{G\theta}) + x_{B\theta} \cdot (L_{B\theta}/y_{B\theta})}{(L_{R\theta}/y_{R\theta}) + (L_{G\theta}/y_{G\theta}) + (L_{B\theta}/y_{B\theta})} \\ y_{w_\theta} = \dfrac{L_{R\theta} + L_{G\theta} + L_{B\theta}}{(L_{R\theta}/y_{R\theta}) + (L_{G\theta}/y_{G\theta}) + (L_{B\theta}/y_{B\theta})} \\ L_{R\theta} + L_{G\theta} + L_{B\theta} = 1 \end{cases},$$

in which $L_{R\theta}$, $L_{G\theta}$ and $L_{B\theta}$ respectively represent a light intensity of the red light at the any non-zero exiting angle $\theta$, a light intensity of the green light at the any non-zero exiting angle $\theta$ and a light intensity of the blue light at the any non-zero exiting angle $\theta$, $R(x_{R\theta}, y_{R\theta})$, $G(x_{G\theta}, y_{G\theta})$ and $B(x_{B\theta}, y_{B\theta})$ respectively represent a chromaticity value of the red light at the any non-zero exiting angle $\theta$, a chromaticity value of the green light at the any non-zero exiting angle $\theta$ and a chromaticity value of the blue light at the any non-zero exiting angle $\theta$, $W(x_{w\theta}, y_{w\theta})$ represents a chromaticity coordinate of white light formed by mixing the red light, the green light and the blue light at the any non-zero exiting angle $\theta$, and $W(x_{w\theta}, y_{w\theta})$ is same as a chromaticity coordinate of white light at the exiting angle of 0°. Because the color coordinate of the white light at the exiting angle of 0° is also determined by the curves illustrated in FIG. 2, the light intensity $L_{R\theta}$ of the red light at the any non-zero exiting angle $\theta$, the light intensity $L_{G\theta}$ of the green light at the any non-zero exiting angle $\theta$ and the light intensity $L_{B\theta}$ of the blue light at the any non-zero exiting angle $\theta$ are normalized to 1, and then it is allowed that at different non-zero exiting angles, the light intensity ratio of the red light, the green light and the blue light satisfy that the chromaticity coordinate of the white light formed after the color mixing is same as the chromaticity coordinate of the white light formed after the color mixing at the exiting angle of 0°. Therefore, the light intensity ratio at the any non-zero exiting angle $\theta$ is simply determined.

According to at least one embodiment of the present disclosure, after the light intensity ratio of the red light at the any non-zero exiting angle, the green light at the any non-zero exiting angle and the blue light at the any non-zero exiting angle is determined, a required brightness of the red light at the any non-zero exiting angle after the brightness attenuation, a required brightness of the green light at the any non-zero exiting angle after the brightness attenuation and a required brightness of the blue light at the any non-zero exiting angle after the brightness attenuation are determined based on the brightness attenuation curves of the red light, the green light and the blue light in the direction of the any non-zero exiting angle, and based on the brightness of the light emitted by the red light-emitting element, the brightness of the light emitted by the green light-emitting element and the brightness of the light emitted by the third light-emitting element, and further the light transmittance value of the first color filter layer in condition that the light exits from the first color filter layer at the any non-zero exiting angle of $\theta$, the light transmittance value of the second color filter layer in condition that the light exits from the second color filter layer at the any non-zero exiting angle θ and the light transmittance value of the third color filter layer in condition that the light exits from the second color filter layer at the any non-zero exiting angle θ are determined.

Figure 8:
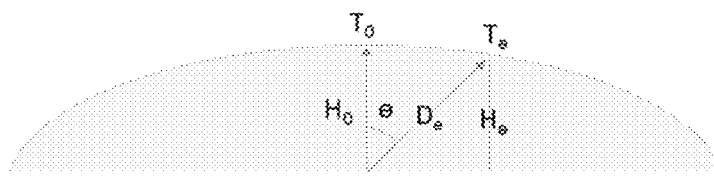
FIG. 8 is a schematic structural diagram of a first color filter layer having a first convex surface provided by an embodiment of the present disclosure.

For example, FIG. 8 is a schematic structural diagram of the first color filter layer having the first convex surface provided by an embodiment of the present disclosure. As illustrated in FIG. 8, the first color filter layer has the first convex surface, and a length $D_\theta$ of a light path that the red light actually passes through at the any non-zero exiting angle θ satisfies a formula as follows:

$$D_\theta = H_0 \cdot \log_{T0} T_\theta.$$

Further, a thickness $H_{\theta 1}$ of the first color filter layer at the any non-zero exiting angle θ is determined by a formula as follows:

$$H_{\theta 1} = D_\theta \cdot \cos\theta = H_0 \cdot \cos\theta \cdot \log_{T01} T_{\theta 1},$$

$H_0$ represents the central thickness, that is a known thickness value, and the thickness $H_0$ is the thickness of the first color filter layer at the first symmetrical center, θ represents the any non-zero exiting angle, $_{01}$ represents a light transmittance value of the first color filter layer in condition that the light exits from the first color filter layer at the exiting angle of 0°, $D_\theta$ represents the length of the light path that the red light actually passes through at the any non-zero exiting angle. $T_{\theta 1}$ represents a light transmittance value of the first color filter layer in condition that the red light exits from the first color filter layer at the any non-zero exiting angle of θ, and all the $H_0$, $T_0$ and θ are known values.

Figure 9:
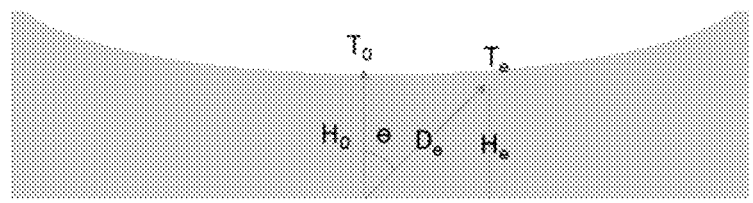
FIG. 9 is a schematic structural diagram of a second color filter layer having a first concave surface provided by an embodiment of the present disclosure.

For example, FIG. 9 is a schematic structural diagram of the second color filter layer having the first concave surface provided by an embodiment of the present disclosure. As illustrated in FIG. 9, the second color filter layer has the first concave surface, and a length $D_\theta$ of a light path that the green light actually passes through at the any non-zero exiting angle θ satisfies a formula as follows:

$$D_\theta = H_0 \cdot \log_{T0} T_\theta.$$

Further, a thickness $H_{\theta 2}$ of the second color filter layer at the any non-zero exiting angle θ is determined by a formula as follows:

$$H_{\theta 2} = D_\theta \cdot \cos\theta = H_0 \cdot \cos\theta \cdot \log_{T02} T_{\theta 2},$$

$H_0$ represents the central thickness, that is the known thickness value, and the thickness $H_0$ is the thickness of the second color filter layer at the second symmetrical center, θ represents the any non-zero exiting angle, $T_{02}$ represents the light transmittance value of the second color filter layer in condition that the light exits from the second color filter layer at the exiting angle of 0°, $D_\theta$ represents the length of a light path that the green light actually passes through at the any non-zero exiting angle. $T_{\theta 2}$ represents a light transmittance value of the second color filter layer in condition that the green light exits from the second color filter layer at the exiting angle of θ, and all the $H_0$, $T_0$ and θ are known values.

For example, in a case that the third color filter layer has the second convex surface or the second concave surface, the descriptions of the third color filter layer may refer to the above descriptions of the first color filter layer having the first convex surface and the second color filter layer having the first concave surface, which are omitted herein.

In summary, in the manufacturing method of the organic light-emitting display panel, firstly, the shapes (having the convex surface or the concave surface) of the surfaces, which are away from the substrate, respectively of the first color filter layer (the red color filter layer), the second color filter layer (the green color filter layer) and the third color filter layer (the blue color filter layer) are determined according to the brightness attenuation of the red light, the brightness attenuation of the green light and the brightness attenuation of the blue light respectively, and then, based on the principle that the white light after the color mixing has the consistent chromaticity at various light exiting angles, the brightness of the red light when exiting from the red color filter layer, the brightness of the green light when exiting from the green color filter layer and the brightness of the blue light when exiting from the blue color filter layer are determined, and further the specific shapes and the thickness parameters of the first color filter layer, the second color filter layer and the third color filter layer are simply determined. Therefore, the organic light-emitting display panel with a better display effect can be simply obtained by using the manufacturing method, and the problem of view angle chromaticity deviation in the technology that a color filter layer is on a light-emitting element (CF ON EL, COE) is alleviated. In addition, the manufacturing method does not involve an improvement of complicated processes, and it is only required to make some simple changes on a general manufacturing process flow of the organic light-emitting display panel, and therefore the manufacturing method is also beneficial to popularization in practical application.

Figure 10:
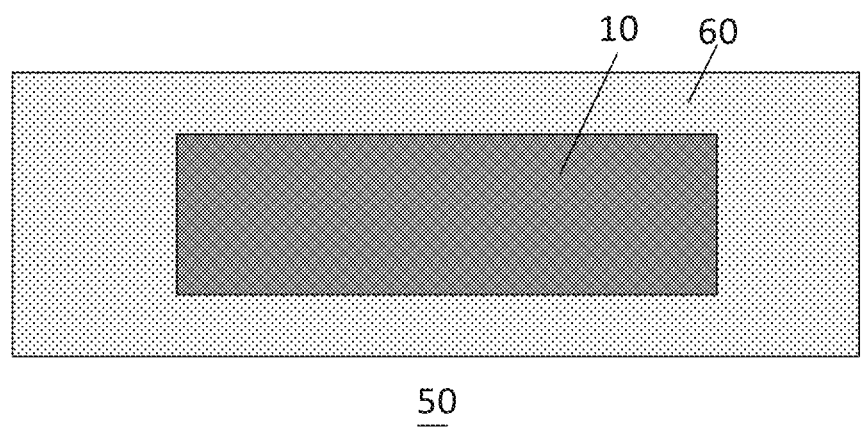
FIG. 10 is a schematic planar view of an organic light-emitting display device provided by an embodiment of the present disclosure.
Figure 11:
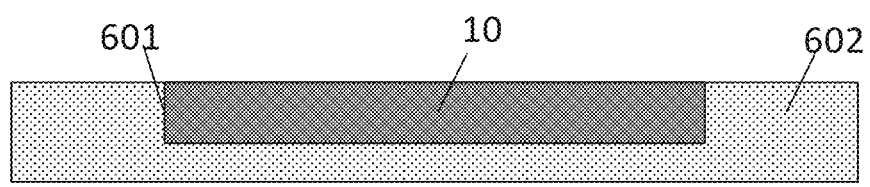
FIG. 11 is a schematic cross-sectional structural diagram of an organic light-emitting display device provided by an embodiment of the present disclosure.

At least one embodiment of the present disclosure further provides an organic light-emitting display device. For example, FIG. 10 is a schematic planar view of an organic light-emitting display device provided by an embodiment of the present disclosure, FIG. 11 is a schematic cross-sectional structural diagram of an organic light-emitting display device provided by an embodiment of the present disclosure. Combining FIG. 10 with FIG. 11, the organic light-emitting display device 50 comprises any one of the organic light-emitting display panels 10 in the embodiments mentioned above and a casing 60; the casing 60 comprises a back casing 601 which defines an accommodating space and a side frame 602, the organic light-emitting display panel 10 is inside the accommodating space, and a light exiting side of the organic light-emitting display panel 10 is on a side of the organic light-emitting display panel facing away from the back casing 601. In this way, the organic light-emitting display device 50 has all of the features and advantages of the organic light-emitting display panel in any one of the above embodiments, which are omitted herein. In general, the color filter layers of different colors included in the organic light-emitting display panel have specific shapes, so that light intensities of the light of different colors when actually exits after passing through the corresponding color filter layers can be adjusted, and thus the chromaticities of the white light exits at different view angles after color mixing can be substantially consistent. Therefore, the problem that the organic light-emitting display panel has view angle chromaticity deviation at different view angles is alleviated.

For example, the organic light-emitting display device 50 is a mobile phone, a tablet computer, a television, a display, a notebook computer, a digital picture frame, a navigator and any other product or component having a display function. Other essential components of the organic light-emitting display device should be understood by those skilled in the art, which are omitted herein and should not be taken as a limitation of the present disclosure. The implementation of the organic light-emitting display device can refer to the above-mentioned embodiments of the display panel, which are omitted herein.

The organic light-emitting display panel, the manufacturing method of the organic light-emitting display panel and the organic light-emitting display device provided by the embodiments of the present disclosure have at least one of the following beneficial effects.

(1) In the organic light-emitting display panel provided by the embodiments of the present disclosure, the chromaticities of the white light formed by different mixed colors can be substantially consistent by adjusting the thickness of the first color filter layer (the red color filter layer), the thickness of the second color filter layer (the green color filter layer) and the thickness of the third color filter layer (the blue color filter layer) at different exiting angles and controlling the light intensity of the red light, the light intensity of the green light and the light intensity of the blue light at various view angles according to the chromaticity deviations (color coordinates) of the light of the three different colors which are the red light, the green light and the blue light at different exiting angles and color coordinates of the white light to be obtained.

(2) In the organic light-emitting display panel provided by the embodiment of the present disclosure, the color filter layers corresponding to the light-emitting elements emitting light of different colors of the organic light-emitting display panel have specific shapes, so that light paths of the light emitted by the light-emitting elements emitting light of different colors when passing through the corresponding color filter layers can be adjusted, and thus light intensities of the light of different colors when actually exits after passing through the corresponding color filter layers can be adjusted, so that the chromaticity of white light exits at different view angles after color mixing can be substantially consistent. Therefore, the problem that the organic light-emitting display panel has view angle chromaticity deviation at different view angles is alleviated.

The following should be noted:

(1) The drawings of the embodiments of the present disclosure only refer to the structures related to the embodiments of the present disclosure, and other structures may refer to the general design.

(2) For the sake of clarity, in the drawings used to describe embodiments of the present disclosure, the thicknesses of layers or regions are enlarged or reduced, that is, these drawings are not drawn to actual scale. It should be understood that in a case where an element such as a layer, a film, a region or a substrate is referred to as being "on" or "under" another element, the element may be directly "on" or "under" the other element or intervening elements may be present.

(3) Without conflict, the embodiments of the present disclosure and the features in the embodiments can be combined with each other to obtain new embodiments.

What are described above are illustrative embodiments of the present disclosure only and not limitative to the scope of the present disclosure. Any changes or substitutions that are easily for those skilled in the art to envisage should within the technical scope disclosed in the present disclosure. Therefore, the protection scope of the present disclosure should be based on the protection scope of the accompanying claims.

What is claimed is:

1. An organic light-emitting display panel, comprising:
    a substrate;
    a first light-emitting element and a second light-emitting element both on the substrate;
    a first color filter layer on a light exiting side of the first light-emitting element and a second color filter layer on a light exiting side of the second light-emitting element,
    wherein a color of light emitted by the first light-emitting element is different from a color of light emitted by the second light-emitting element;
    the color of the light emitted by the first light-emitting element is same as a color of the first color filter layer, and the color of the light emitted by the second light-emitting element is same as a color of the second color filter layer;
    with an increase of an exiting angle, a brightness attenuation speed of the light emitted by the first light-emitting element is faster than a brightness attenuation speed of the light emitted by the second light-emitting element, and the exiting angle is an included angle between exiting light and a normal perpendicular to the substrate; and
    the first color filter layer has a first convex surface protruding toward a side away from the first light-emitting element, and the first convex surface is on an entire upper side of the first color filter layer away from the first light-emitting element; and the second color filter layer has a first concave surface recessed toward a side close to the second light-emitting element, and the first concave surface is on an entire upper side of the second color filter layer away from the second light-emitting element.

2. The organic light-emitting display panel according to claim 1, wherein
    the first color filter layer has the first convex surface, the first convex surface has a first symmetrical center, and an exiting angle of the light emitted by the first light-emitting element at the first symmetrical center is 0°; and
    the second color filter layer has the first concave surface, the first concave surface has a second symmetrical center, and an exiting angle of the light emitted by the second light-emitting element at the second symmetrical center is 0°.

3. The organic light-emitting display panel according to claim 2, wherein
    a thickness of the first color filter layer at the first symmetrical center of the first convex surface is equal to a thickness of the second color filter layer at the second symmetrical center of the first concave surface, and both the thickness of the first color filter layer at the first symmetrical center of the first convex surface and the thickness of the second color filter layer at the second symmetrical center of the first concave surface are a central thickness; the thickness of the first convex surface gradually decreases from the first symmetrical center of the first convex surface to two opposite edges of the first convex surface; the thickness of the first concave surface gradually increases from the second symmetrical center of the first concave surface to two opposite edges of the first concave surface.

4. The organic light-emitting display panel according to claim 3, wherein
    a thickness of the first color filter layer and a thickness of the second color filter layer are configured such that a light intensity of white light formed by mixing monochromatic light emitted from the first color filter layer at any non-zero exiting angle and monochromatic light emitted from the second color filter layer at the any non-zero exiting angle is same as a light intensity of white light with an exiting angle of 0°.

5. The organic light-emitting display panel according to claim 3, further comprising a third light-emitting element and a third color filter layer, wherein
the third color filter layer is on a light exiting side of the third light-emitting element;
a color of light emitted by the third light-emitting element is different from both the color of the light emitted by the first light-emitting element and the color of the light emitted by the second light-emitting element;
the color of the light emitted by the third light-emitting element is same as a color of the third color filter layer;
with the increase of the exiting angle, a brightness attenuation speed of the light emitted by the third light-emitting element is between the brightness attenuation speed of the light emitted by the first light-emitting element and the brightness attenuation speed of the light emitted by the second light-emitting element; and
a surface of the third color filter layer on a side of the third color filter layer away from the third light-emitting element comprises a second convex surface protruding toward a side away from the third light-emitting element, or a second concave surface recessed toward a side close to the third light-emitting element, or a flat surface.

6. The organic light-emitting display panel according to claim 5, wherein
the third color filter layer has the second convex surface, and a curvature of the second convex surface of the third color filter layer is smaller than a curvature of the first convex surface of the first color filter layer; or,
the third color filter layer has the second concave surface, and a curvature of the second concave surface of the third color filter layer is smaller than a curvature of the first concave surface of the second color filter layer.

7. The organic light-emitting display panel according to claim 6, wherein
all of the thickness of the first color filter layer, the thickness of the second color filter layer and a thickness of the third color filter layer are in a range of 0.5 micron to 5 microns; and
all of the curvature of the first convex surface, the curvature of the first concave surface, the curvature of the second convex surface and the curvature of the second concave surface are less than 0.036.

8. The organic light-emitting display panel according to claim 5, wherein a thickness of the third color filter layer at a third symmetrical center of the second convex surface, the thickness of the first color filter layer at the first symmetrical center of the first convex surface, and the thickness of the second color filter layer at the second symmetrical center of the first concave surface are equal to each other and all of which are the central thickness.

9. The organic light-emitting display panel according to claim 8, wherein
a thickness $H_{\theta 1}$ of the first color filter layer at any non-zero exiting angle $\theta$ satisfies:

$$H_{\theta 1}=H_0 \cdot \cos\theta \cdot \log_{T_{01}} T_{\theta 1},$$

wherein $H_0$ represents the central thickness, $\theta$ represents the any non-zero exiting angle, $T_{01}$ represents a light transmittance value of the first color filter layer in condition that the light exits from the first color filter layer at an exiting angle of 0°, and $T_{\theta 1}$ represents a light transmittance value of the first color filter layer in condition that the light exits from the first color filter layer at the any non-zero exiting angle of $\theta$;
a thickness $H_{\theta 2}$ of the second color filter layer at the any non-zero exiting angle $\theta$ satisfies:

$$H_{\theta 2}=H_0 \cdot \cos\theta \cdot \log_{T_{02}} T_{\theta 2},$$

wherein $H_0$ represents the central thickness, $\theta$ represents the any non-zero exiting angle, $T_{02}$ represents a light transmittance value of the second color filter layer in condition that the light exits from the second color filter layer at the exiting angle of 0°, and $T_{\theta 2}$ represents a light transmittance value of the second color filter layer in condition that the light exits from the second color filter layer at the any non-zero exiting angle of $\theta$;
a thickness $H_{\theta 3}$ of the third color filter layer at the any non-zero exiting angle $\theta$ satisfies:

$$H_{\theta 3}=H_0 \cdot \cos\theta \cdot \log_{T_{03}} T_{\theta 3},$$

wherein $H_0$ represents the central thickness, $\theta$ represents the any non-zero exiting angle, $T_{03}$ represents a light transmittance value of the third color filter layer in condition that the light exits from the third color filter layer at the exiting angle of 0°, and $T_{\theta 3}$ represents a light transmittance value of the third color filter layer in condition that the light exits from the third color filter layer at the any non-zero exiting angle of $\theta$.

10. The organic light-emitting display panel according to claim 9, wherein
the first light-emitting element is a red light-emitting element configured to emit red light, the second light-emitting element is a green light-emitting element configured to emit green light, and the third light-emitting element is a blue light-emitting element configured to emit blue light.

11. The organic light-emitting display panel according to claim 10, wherein
the $T_{\theta 1}$ of the first color filter layer, the $T_{\theta 2}$ of the second color filter layer and the $T_{\theta 3}$ of the third color filter layer are configured to allow that a chromaticity coordinate of white light formed by mixing the red light which is emitted at the any non-zero exiting angle of $\theta$ after passing through the first color filter layer, the green light which is emitted at the any non-zero exiting angle of $\theta$ after passing through the second color filter layer, and the blue light which is emitted at the any non-zero exiting angle of $\theta$ after passing through the third color filter layer is same as a chromaticity coordinate of white light formed by mixing the red light which is emitted at the first symmetrical center of the first color filter layer, the green light which is emitted at the second symmetrical center of the second color filter layer and the blue light which is emitted at the third symmetrical center of the third color filter layer.

12. An organic light-emitting display device, comprising the organic light-emitting display panel according to claim 1 and a casing, wherein
the casing comprises a back casing which defines an accommodating space and a side frame, the organic light-emitting display panel is inside the accommodating space, and a light exiting side of the organic light-emitting display panel is on a side of the organic light-emitting display panel facing away from the back casing.

* * * * *